US012003233B1

(12) United States Patent
Tripathi et al.

(10) Patent No.: US 12,003,233 B1
(45) Date of Patent: Jun. 4, 2024

(54) HIGH BANDWIDTH INTEGRATED MULTIPLEXER AND DRIVER STAGE FOR TRANSMITTER

(71) Applicant: Synopsys, Inc., Mountain View, CA (US)

(72) Inventors: Varun Kant Tripathi, Bengaluru (IN); Shourya Kansal, Immadihalli (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/050,822

(22) Filed: Oct. 28, 2022

(51) Int. Cl.
*H04B 1/02* (2006.01)
*G06F 1/04* (2006.01)
*H03K 17/687* (2006.01)
*H03K 17/693* (2006.01)
*H03K 19/0175* (2006.01)
*H03K 19/20* (2006.01)
*H04B 1/04* (2006.01)

(52) U.S. Cl.
CPC ........... *H03K 17/6872* (2013.01); *G06F 1/04* (2013.01); *H03K 17/693* (2013.01); *H03K 19/0175* (2013.01); *H03K 19/20* (2013.01); *H04B 1/04* (2013.01)

(58) Field of Classification Search
CPC .......... H04B 1/02; H04B 1/04; H04B 1/0483; H03K 17/687; H03K 17/6872; H03K 17/693; H03K 19/0175; H03K 19/20; G06F 1/04; G06F 1/06; H04L 27/04; H04L 27/0097

See application file for complete search history.

(56) References Cited

U.S. PATENT DOCUMENTS

2022/0115941 A1* 4/2022 May ........................ H02M 1/08

* cited by examiner

*Primary Examiner* — Long Nguyen
(74) *Attorney, Agent, or Firm* — Weaver Austin Villeneuve & Sampson LLP

(57) ABSTRACT

A system for serializing data includes, in part, serialization circuitry configured to convert input data provided through parallel input streams into a lesser number of parallel output streams. The input data is converted through sampling based on a set of clock signals that are phase-offset. The system further includes a pre-driver circuit having combinational logic including a first multiplexer. The first multiplexer is configured to generate an output of the pre-driver circuit through combining the converted input data such that the number of parallel output streams is reduced. The system further includes a driver circuit configured to generate, using the output of the pre-driver circuit, a final output stream corresponding to the input data in serial format. The driver circuit is integrated with a second multiplexer, with the output of the pre-driver circuit operating as both control input and data input to the second multiplexer.

19 Claims, 10 Drawing Sheets

HIGH BANDWIDTH INTEGRATED MULTIPLEXER AND DRIVER STAGE FOR TRANSMITTER

TECHNICAL FIELD

The present application generally relates to an integrated circuit (IC), and more particularly to a high bandwidth integrated multiplexer (MUX) and driver stage for a transmitter.

BACKGROUND

Communications systems are often required to transmit data at high speed. The amount of data to be transmitted continues to grow in correspondence with the processing capabilities of modern computers. As the speed and quantity of data being transmitted grows, the capabilities of existing communications systems to keep up with such demands may be limited by bandwidth, latency, linearity, noise, and other factors. One way to provide high speed data transmission is using a Serializer-Deserializer (SerDes) based communications system. In SerDes, a serializer in a transmitter operates to serialize multiple parallel input streams into a single output stream, and a deserializer in a receiver transforms the output stream from the transmitter into parallel output streams, thereby recovering the original data for further processing at the receiver.

SUMMARY

A system in accordance with one embodiment of the present disclosure includes, in part, a clock source configured to generate a set of clock signals that are phase-offset. The system further includes serialization circuitry configured to convert input data provided through parallel input streams into a lesser number of parallel output streams. To convert the input data, the serialization circuitry samples the input data using the clock signals. The system further includes a pre-driver circuit having combinational logic. The combinational logic of the pre-driver circuit includes a first multiplexer. The first multiplexer is configured to generate an output of the pre-driver circuit through combining the converted input data such that the lesser number of parallel output streams is further reduced. The system further includes a driver circuit configured to generate, using the output of the pre-driver circuit, a final output stream corresponding to the input data in serial format. The driver circuit is integrated with a second multiplexer, with the output of the pre-driver circuit operating as both control input and data input to the second multiplexer.

In one embodiment, the driver circuit includes p-channel metal-oxide-semiconductor (PMOS) transistors and n-channel metal-oxide-semiconductor (NMOS) transistors, with the output of the pre-driver circuit forming gate inputs to the PMOS transistors and the NMOS transistors. In one embodiment, the combinational logic of the pre-driver circuit includes OR gates and AND gates. Each AND gate forms a gate input to a corresponding PMOS transistor. Each OR gate forms a gate input to a corresponding NMOS transistor. In one embodiment, the final output stream is formed at a node where drain terminals of the PMOS transistors are connected to drain terminals of the NMOS transistors.

In one embodiment, the serialization circuitry includes a first set of logic gates, and the combinational logic of the pre-driver circuit includes a second set of logic gates. Each logic gate in the first set of logic gates operates on a corresponding data input and a subset of the clock signals generated by the clock source. Each logic gate in the second set of logic gates operates on outputs from two or more logic gates in the first set of logic gates. In one embodiment, the subset of clock signals on which a logic gate in the first set of logic gates operates is a pair of clock signals that are phase-offset by one unit interval.

In one embodiment, the set of clock signals generated by the clock source represents four phases of a clock operating at a frequency four times slower than a baud rate of the final output stream. In one embodiment, the first multiplexer generates the output of the pre-driver circuit at half the baud rate of the final output stream. In one embodiment, the first multiplexer is a 4:2 multiplexer, and the second multiplexer is a 2:1 multiplexer. In one embodiment, the final output stream corresponds to an output of a transmitter in a SerDes interface.

A method of serializing data, in accordance with one embodiment of the present disclosure, includes, in part, obtaining a set of clock signals that are phase-offset; and converting input data provided through parallel input streams into a lesser number of parallel output streams, where the converting of the input data involves sampling the input data using the clock signals. The method further includes generating, using combinational logic including a first multiplexer, an intermediate output through combining the converted input data such that the lesser number of parallel output streams is further reduced; and generating, using a second multiplexer integrated with a driver circuit, a final output stream corresponding to the input data in serial format, with the intermediate output operating as both control input and data input to the second multiplexer.

A pre-driver circuit, in accordance with one embodiment of the present disclosure, includes combinational logic. The combinational logic of the pre-driver circuit includes a first multiplexer and is configured to combine input data provided through parallel input streams into a lesser number of parallel output streams. The input data combined by the combinational logic corresponds to partially serialized data that was sampled using phase-offset clocks. The combinational logic is further configured to generate the lesser number of parallel output streams such that these output streams can be used as both control input and data input to a second multiplexer communicatively coupled to the pre-driver circuit. The second multiplexer, which can be a multiplexer integrated with a driver circuit, is configured to generate a final output stream corresponding to the input data in serial format.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 is a simplified block diagram of a transmitter according to certain embodiments.

DETAILED DESCRIPTION

Figure 1:
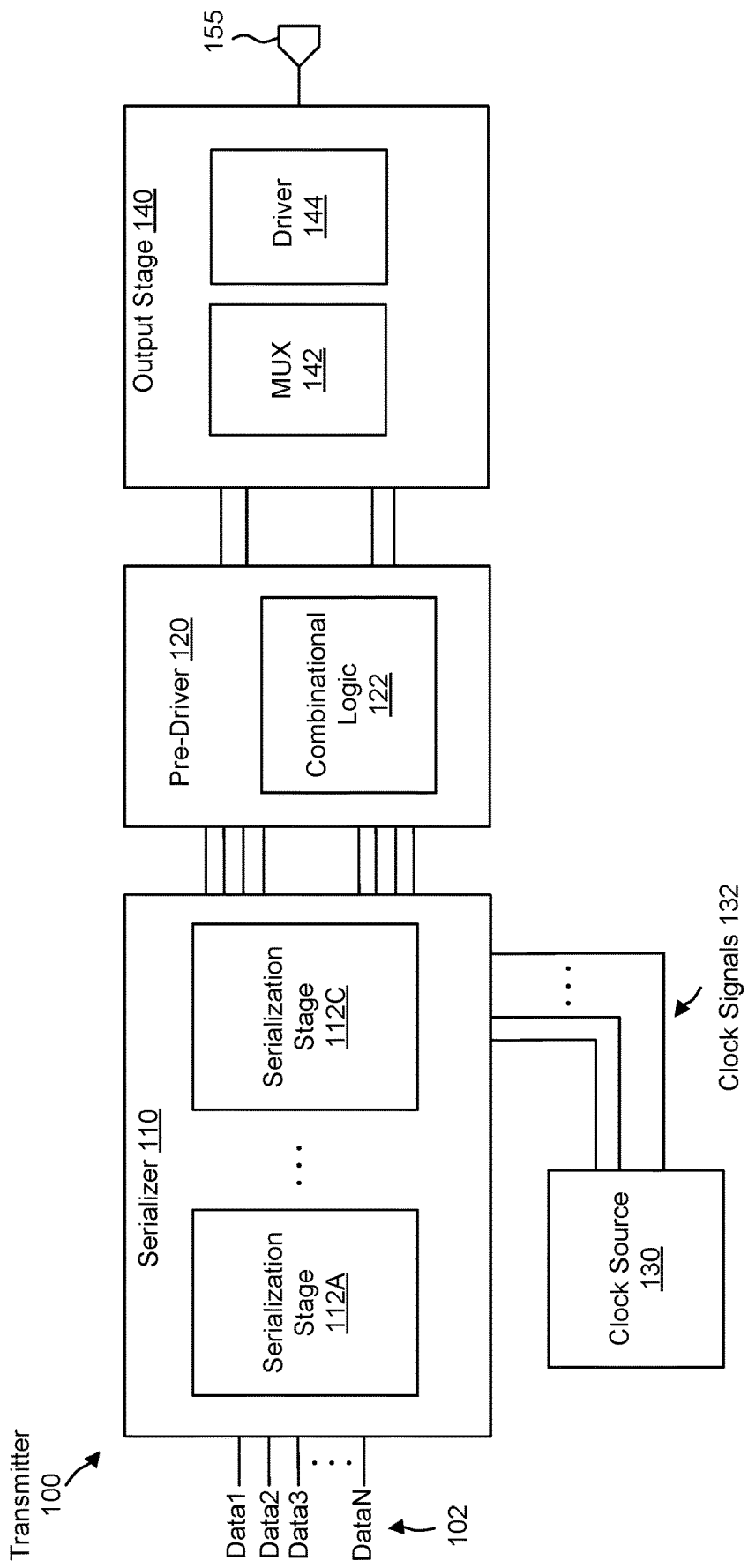

Aspects of the present disclosure relate to a high bandwidth integrated MUX and driver stage for a transmitter, e.g., for an ultra-high speed wireline transmitter/receiver (transceiver). The techniques disclosed herein can be applied to implement a transmitter in a SerDes based communications system. However, the disclosed embodiments are not limited to SerDes. Additionally, throughout the disclosure, reference is sometimes made to specific communications protocols or coding schemes. However, the embodiments of the present disclosure can be used in other operating environments and are not limited to any particular protocol or coding scheme. More generally, the embodiments of the present disclosure may be used in any situation where input data in parallel format is to be converted into serial format.

In high-speed transmitters, the final stage of serialization is a challenging design task due to performance requirements that the transmitter is expected to meet. When serializing data for transmission, the final stage of serialization is often designed to meet a narrow timing path, for example, a unit interval (UI) of 1 UI (equal to 1/baud rate) or 2 UI depending on the architecture of the serializer. Additional requirements may also be specified in terms of signal-to-noise distortion ratio (SNDR), linearity, or other performance parameters, which may be governed by the communications protocol used by the transmitter and the receiver. For example, the transmitter may be required to have a minimum SNDR of 32.5 dB (decibels) and a minimum linearity expressed in terms of an $R_{LM}$ (level separation mismatch ratio) of 0.95. Linearity is also sometimes expressed in terms of the ratio between minimum and maximum eye amplitudes in the eye diagram of the transmitter. As such, designing a serializer can be challenging and typically involves optimizing tradeoffs between transmission rate (bandwidth), timing constraints imposed on components along the data path, power consumption, linearity, device size, and/or other design considerations.

Another challenge to serializer design is the technology process node speed limit with which signals can be propagated. When signals are transmitted at high speed, such signals may suffer from intersymbol interference (ISI), with the result that signal levels (e.g., voltage magnitude) deviate to the point where the ISI cannot be adequately resolved using traditional methods such as feed-forward equalization (FFE). In such instances, a receiver device may not be able to successfully recover the data. One way to address this problem is to perform final multiplexing (muxing) at the output pad of the transmitter, e.g., at the driver. For example, the driver may be provided with a 4:1 MUX. However, 4:1 muxing can severely limit the bandwidth at the output pad due to parasitic capacitance associated with the muxing components. Accordingly, some embodiments provide for a lower level of muxing at the driver, e.g., 2:1. Under an approach such as a half rate transmitter architecture with 2:1 muxing at the driver, the component providing the input to the driver (e.g., the pre-driver or the final stage of the serializer) would be operating at a speed corresponding to baud rate/2. This would make timing closure difficult as designing for such high speed at the input node to the driver can be challenging.

To address these and other challenges, embodiments of the present disclosure are directed to the architecture of a serializer in a transmitter that also includes a driver circuit. In some embodiments, the serializer is a multi-stage serializer with a "final" stage that generates input to a pre-driver circuit. The output of the pre-driver includes a set of parallel data streams and is essentially an intermediate output which corresponds to a partially serialized version of the input data to the serializer. Parallel input data streams are successively combined through the various stages of the serializer. The number of data streams in the output of the pre-driver depends on implementation. In some embodiments, the pre-driver is configured to operate as a 4:2 MUX, meaning the pre-driver combines four parallel inputs into two parallel outputs. Irrespective of the number of data streams in the output of the pre-driver, the resulting output is further combined by a second MUX to form a single output stream in serial format. As discussed in further detail below, this second MUX can be integrated into the driver portion of the transmitter, e.g., as a 2:1 MUX. In this manner, the driver may be configured to complete the serialization of the input data.

Separating the serialization into multiple stages, including stages that occur before as well as after the data reaches the driver, has certain advantages. For instance, doing so may relax the timing constraints of both the earlier stages as well as the driver stage, making it easier for a circuit designer to perform timing closure (e.g., manually or using automated design tools) on the various components along the data path. As another example, the pre-driver may help to offload some of the signal processing that would otherwise have been done at the driver. As a result, the number of circuit elements (e.g., transistors) in the driver may be reduced, which in turn reduces the parasitic capacitance associated with the driver. Parasitic capacitance is a significant contributor to bandwidth degradation, so reducing the parasitic capacitance along the data path can increase the bandwidth relative to designs that feature a higher amount of parasitic capacitance. Power consumption may also be improved as a result of spreading the serialization over multiple stages. These and other advantages will be apparent to a person skilled in the art in light of the present disclosure.

In order to address the challenges described above, embodiments of the present disclosure are directed to serialization performed over the course of multiple stages, including serialization at a pre-driver and serialization at a driver. In particular, embodiments are described in which some initial serialization is performed using serialization circuitry in preparation for further serialization by the pre-driver and the driver. In the present disclosure, this serialization circuitry may be referred to as the serializer of the transmitter in order to distinguish the earlier serialization stages from the operations of the pre-driver and the driver. However, since the final serialized data may correspond to an output stream produced by the driver, the pre-driver and the driver can also be considered components of the serializer.

In some embodiments, the pre-driver operates on data supplied at a slower speed, e.g., baud rate/4. As discussed below, the pre-driver can be implemented using combinational logical that enables the pre-driver to perform muxing at whichever data rate is required by the driver, e.g., baud rate/2 in connection with 2:1 muxing at the driver. In this manner, timing closure can be performed based on a lower speed while at the same time avoiding overloading the driver with parasitic elements.

FIG. 1 is a simplified block diagram of a transmitter 100 according to certain embodiments. The transmitter 100 includes a serializer 110, a pre-driver 120, a clock source 130, and an output stage 140. The transmitter 100 may be configured to transmit data at any particular chosen or configured transmission speed depending on the requirement and purpose of the transmitter. The transmitter 100 may be a transmitter used to transmit data in a wireline or a wireless communication system. However, the methods and systems disclosed here can be applied to any transmitter of any transmission speed. In some embodiments, the transmitter 100 may be part of a SerDes interface. In some embodiments, the transmitter 100 may be used for Ethernet or PCI Express (PCIe) based communications, e.g., between computing devices over one or more networks.

Transmission of data generally requires modulation of the data being transmitted with a carrier signal, e.g., using pulse modulation, frequency modulation, or phase modulation. For example, the transmitter 100 may include circuitry (not shown) that generates input data 102 to the serializer 110 using pulse modulation. Pulse modulation can be performed using a Non-Return-To-Zero (NRZ) coding scheme, which is also known as Pulse Amplitude Modulation 2-Level (PAM2). In PAM2, the pulse can have a voltage level representing either value 1 or 0. Another coding scheme which may be used for pulse modulation is Pulse-Amplitude-Modulation 4-Level (PAM4). In PAM4, the voltage level can be one of four different levels and thus represents two bits logic as 00, 01, 10, and 11. Since PAM4 represents two bits worth of information in each symbol, PAM4 provides double throughput at the same sampling frequency in comparison to PAM2. PAM2 and PAM4 are merely examples of coding schemes that could be used in connection with forming input data for transmission via the serializer 110 and other components of the transmitter 100. The serialization techniques disclosed herein may be used in combination with other coding schemes and/or modulation methods.

As shown in FIG. 1, the serializer 110 may include multiple serialization stages 112 (e.g., 112A to 112C). Further, as discussed below, the pre-driver 120 and the output stage 140 may also correspond to serialization stages. In general, each successive serialization stage is configured to further reduce the number of parallel data streams by combining data streams until the data is finally merged into a single output stream. The serialization stages 112 within the serializer 110 may operate based on clock signals 132 produced by the clock source 130. In contrast, the serialization performed by the pre-driver 120 and the output stage 140 may be performed without the aid of a clock signal. For example, FIG. 1 shows the pre-driver 120 as including combinational logic 122. As discussed below, e.g., in connection with the embodiments of FIGS. 5A and 5B, combinational logic of a pre-driver may implement a MUX that combines data streams using digital logic gates. The serialization stages 112 may also correspond to multiplexing stages, which are not necessarily implemented using combinational logic. For example, in the embodiment of FIG. 2 (discussed below), the serializer 110 includes a digital serialization stage followed by an analog serialization stage.

The final output, which is produced at a pad 155 coupled to the output stage 140, is a single data stream in serial format. FIG. 1 shows a single output pad. However, the data stream produced by the transmitter 100 may be generated as a differential serial output, in which case an additional output pad may be used to communicate the serialized data to a receiver. In the example of FIG. 1, the output stage includes a MUX 142 and a driver 144. The MUX 142 and the driver 144 can be implemented as separate circuits or integrated into the same circuit. Because an output of the transmitter 100 is a single data stream in serial format, the final stage of multiplexing (in this example, the MUX 142) may involve 2:1 multiplexing or some other level of multiplexing that generates the single data stream.

The clock source 130 is configured to generate the clock signals 132 for use in sampling data at various serialization stages that are clocked. These clocked stages may reside in the serializer 110. As such, the clock signals 132 are shown as being coupled to the serializer 110. The clock source 130 may generate the clock signals 132 to be of different phases, but with the same frequency. The clock signals 132 can be derived from a source or reference clock. For example, the clock signals 132 may include four clock signals that are identical but offset by 1 UI, e.g., corresponding to phases of 0, 90, 180, and 270 degrees. However, any number of clock signals may be generated by the clock source 130. Further, the clock signals 132 may be generated as divided clock signals that are slower than the reference clock, e.g., using one or more frequency dividers. The clock source 130 may be a crystal or an oscillator. In some embodiments, the clock source 130 may be implemented using a phase locked loop (PLL). In other embodiments, a non-PLL based clock source may be used.

The frequency of the clock signals 132 depends on the desired transmission speed (baud rate) as well as the communications protocol. For example, in a 112G PAM4 transmitter, the transmission speed is 56 Gbps (Gigabaud per second) because two data symbols are transmitted per UI instead of one symbol per UI, as in PAM2. This would correspond to a UI of 1/56. As such, the clock signals 132 may have a frequency of 56 Ghz (Gigahertz), assuming the transmitter 100 is configured as a full rate transmitter. Other transmitter architectures exist, including half rate transmitters and quarter rate transmitters. Full rate transmitters are less common because operating at full rate requires a faster clock, which leads to higher power consumption and stricter timing constraints. By contrast, a 112G PAM4 half rate transmitter would typically use a clock frequency of 28 Ghz, and a corresponding quarter rate transmitter would use a clock frequency of 14 Ghz.

As mentioned above, the clock signals 132 may be phase-offset, e.g., with phases of 0, 90, 180, and 270 degrees. Multiple phases of a clock are generally used to generate pulses for sampling the data in a half rate or quarter rate transmitter, e.g., on rising edges of each clock signal. For example, with four phases, the transmitter 100 can be configured to operate based on a clock having a frequency corresponding to that which would be used in a conventional quarter rate transmitter, e.g., 14 Ghz in the example described above. Using a quarter rate clock relaxes the timing requirements as compared to a full rate clock or half rate clock, but there may be performance tradeoffs. For example, to maintain high bandwidth using a quarter rate clock, a first option is to perform final multiplexing (e.g., 4:1 muxing) at the pre-driver 120. However, this could result in poor linearity.

Figure 2:
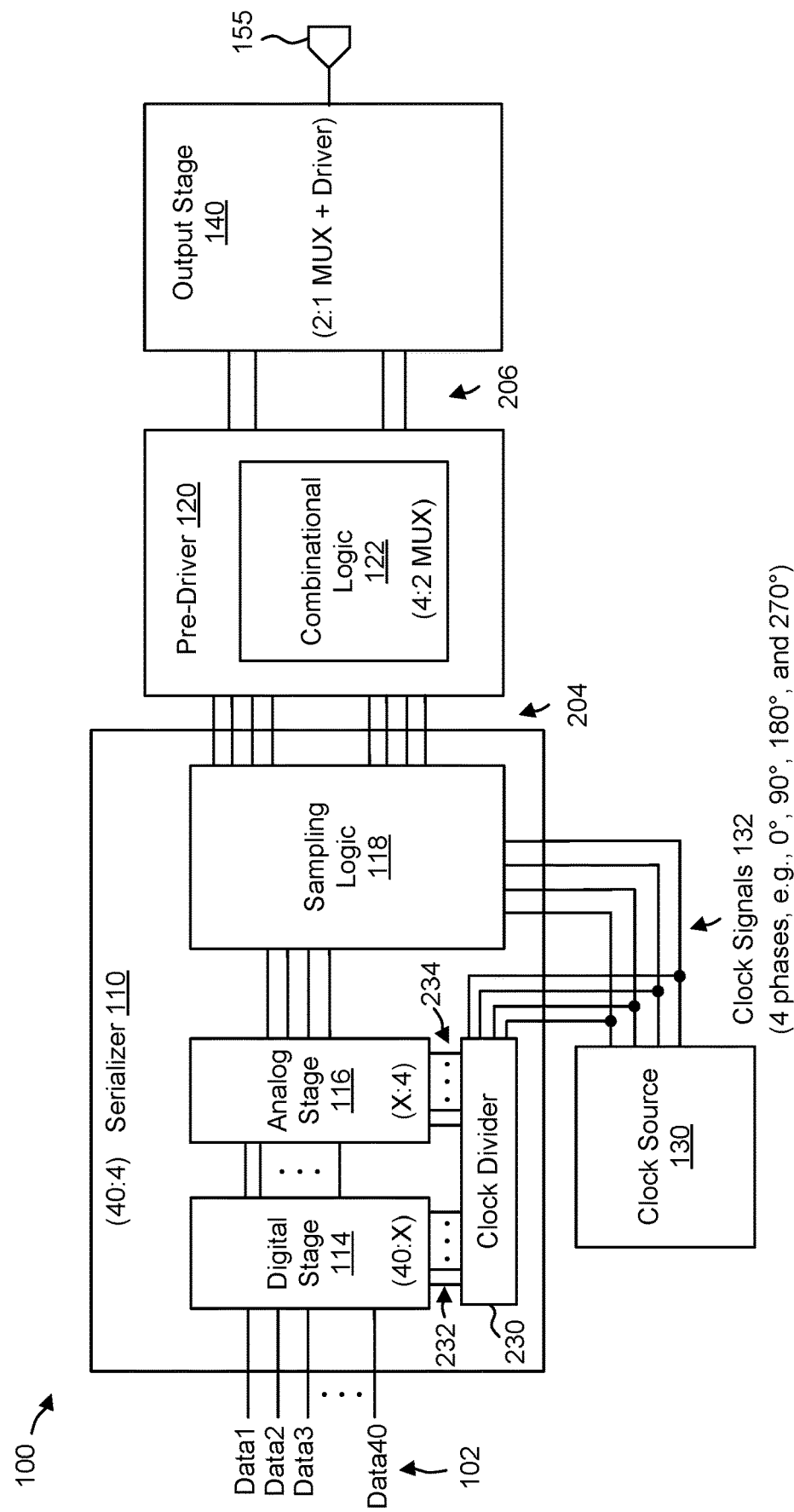
FIG. 2 is a block diagram of an example implementation of the transmitter in FIG. 1.

A second option is to perform final multiplexing at the output stage 140, e.g., using the MUX 142 to form the output stream at the pad 155. The second option could potentially provide for better linearity and lower power compared to the first option, but at the cost of lower bandwidth, e.g., due to increased parasitic coupling at the pad 155. A third option, depicted in FIG. 2, is to split the final multiplexing across the pre-driver 120 and the output stage 140. The third option retains the advantages of the second option (e.g., relaxed timing, lower power, and good linearity), but also provides for relatively high bandwidth.

FIG. 2 is a block diagram of an example implementation of the transmitter 100. In the example of FIG. 2, the input data 102 is provided in forty parallel data streams. Each data stream carries data having a period (symbol duration) of 1 UI, so the total width of the input data 102 is 40 UI. Further, the serializer 110 is configured to perform 40:2 serialization using a digital stage 114 and an analog stage 116. The output data stream formed at the pad 155 represents serial data having a period of 1 UI.

As shown in FIG. 2, the clock source 130 may generate the clock signals 132 as four signals, each having a different phase (e.g., 0, 90, 180, and 270 degrees). Two clock signals (e.g., having 0 and 180 degree phases) may represent the in-phase clock components (I-phase). The other two clock signals (e.g., having 90 and 270 phases) may represent the quadrature clock components (Q-phase). The 4-phase clock signals are provided as input to sampling logic 118 that samples the data produced by the analog stage 116. The clock signals 132 and/or other clock signals produced by the clock source 130 may also be provided as input to the digital stage 114 and/or the analog stage 116. In some implementations, the clock signals used by the serialization stages of the serializer 110 are derived from the clock signals 132. For example, FIG. 2 shows the clock signals 132 being input to a clock divider 230 to produce a set of clock signals 232 for the digital stage 114 and another set of clock signals 234 for the analog stage 116. In general, earlier serialization stages operate at a slower frequency compared to later serialization stages. As such, the clock divider 230 could include a first frequency divider to form the clock signals 234 from the clock signals 132 and a second frequency divider to form the clock signals 232 from the clock signals 234.

The digital stage 114 may be implemented using digital logic, e.g., complementary metal-oxide-semiconductor (CMOS) transistors. CMOS transistors include p-channel metal-oxide-semiconductor (PMOS) transistors and n-channel metal-oxide-semiconductor (NMOS) transistors. The digital stage performs 40:X serialization to convert the input data 102 into X number of parallel streams (e.g., X=16). The analog stage 116 performs X:4 serialization to further reduce the number of streams to four. The splitting of the 40:4 serialization across signal processing in analog and digital components may facilitate meeting of timing requirements. However, other implementations of the serializer 110 may involve only digital serialization or only analog serialization.

The sampling logic 118 samples the four streams produced by the analog stage 116 to generate input data 204 to the combinational logic 122 of the pre-driver 120. As discussed below in conjunction with FIGS. 5A and 5B, the combinational logic 122 of the pre-driver may implement a two-part MUX including a first MUX and a second MUX that each operate on four data inputs. As such, the input data 204 is shown in FIG. 2 as eight signal lines. Like the MUX of the pre-driver 120, the sampling logic 118 can also be implemented using combinational logic (e.g., AND gates and OR gates). However, non-combinational logic may also be used to sample the output of the final stage (e.g., the analog stage 116) of the serializer 110.

In FIG. 2, the combinational logic 122 performs 4:2 muxing to produce input data 206 to the output stage 140, which in turn performs 2:1 muxing to form the output data stream at the pad 155. The sampling logic 118 may be configured to generate the input data 204 in such a way that the input data 204 operates as both control input and data input to the MUX of the pre-driver 120. As such, the combinational logic 122 can perform serialization without a separate select signal and without using a clock. Similarly, the combinational logic 122 may be configured to generate the input data 206 such that the input data 206 operates as both control input and data input to the MUX of the output stage 140. The manner in which the muxing is performed at the pre-driver and the output stage is described in further detail below.

Figure 7:
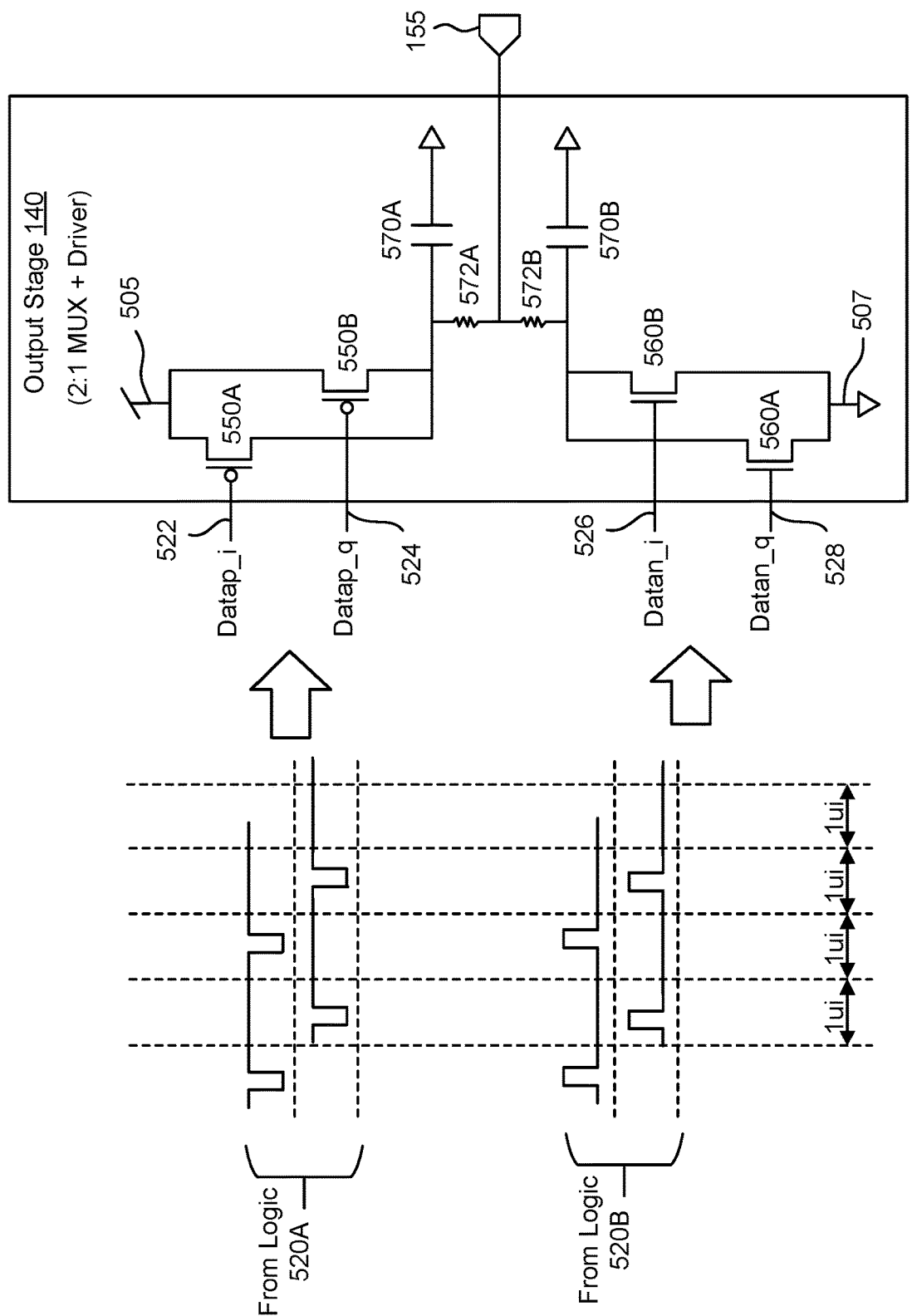
FIG. 7 shows a circuit implementation of a driver according to certain embodiments.

The output stage 140 can be realized as a combined MUX and driver in which circuitry forming a 2:1 MUX is integrated with the circuitry forming the driver. An example implementation of a combined MUX and driver is shown in FIG. 7, discussed below. FIG. 2 is merely one example of how the final muxing can be divided between the pre-driver 120 and the output stage 140. The level of muxing performed at the pre-driver 120 and the output stage 140 may differ in other embodiments. In general, the pre-driver 120 can be configured to generate the input data 206 as any number of data streams for final muxing by the output stage 140.

Figure 3:
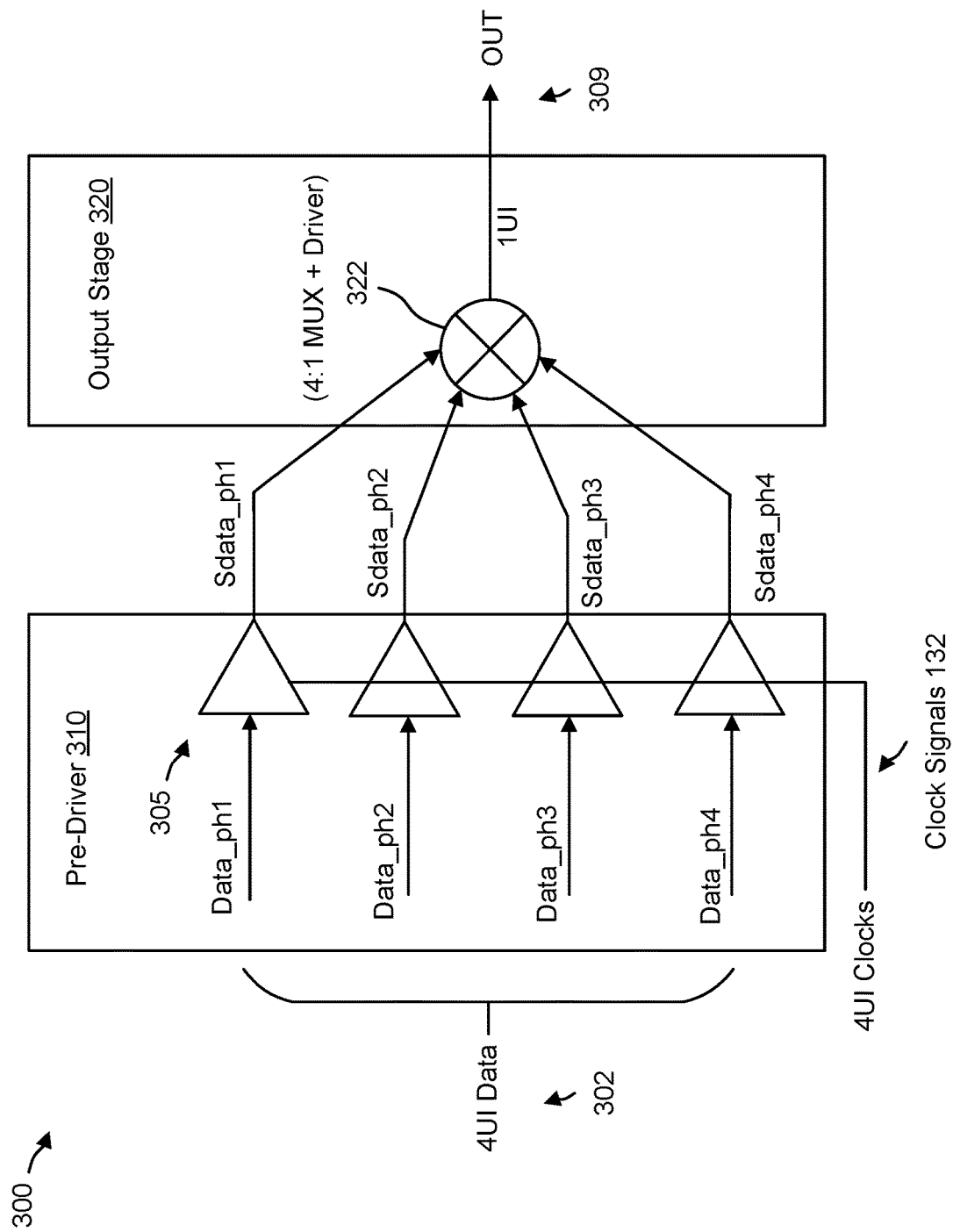
FIG. 3 is a high level schematic of an example output stage and a corresponding pre-driver.

FIG. 3 is a high level schematic of an example output stage and a corresponding pre-driver. FIG. 3 is provided as an example of an implementation in which final muxing is performed at the output stage of the transmitter. In FIG. 3, no muxing is performed at a pre-driver 310. Instead, an output stage 320 operates as a combined 4:1 MUX and driver 322. The pre-driver 310 operates similarly to the sampling logic 118 in FIG. 2 and is configured to sample 4 UI data 302, using the clock signals 132. The data 302 may, for example, correspond to the output of the analog stage 116 or other final stage of the serializer 110. The pre-driver 310 includes four sampling units 305, each configured to sample a respective data stream using a 1 UI sampling pulse derived from a subset of the clock signals 132. As such, each data stream is associated with a corresponding phase of the clock signals 132. Each sampling unit 305 can include or be coupled to a corresponding pulse generator (not shown). The pulse generators can be edge-triggered devices that are activated in response to the rising and/or falling edges of the clock signals 132. The sampled data (labeled "Sdata") produced by the pre-driver 310 forms the inputs to the driver 322, which combines the sampled data into a single output stream 309.

In some implementations, the duration of the sampling pulses may be longer than 1 UI. However, using a 1 UI sampling pulse in conjunction with 4 UI data has timing advantages over longer (e.g., 2 UI) sampling pulses. In general, the shorter the sampling duration in relation to the duration of the data being sampled, the easier it is to align the sampling pulse with respect to the data so that the data is sampled correctly. For instance, a 1 UI sampling pulse may be positioned in the middle of a 4 UI data period by using an adjustable delay line (not shown) to delay or advance the clock signals 132 as needed, leaving 1.5 UI on either side so that a total duration of 3 UI is available as a setup and hold time margin. The clock adjustment can be performed as part of a calibration procedure to compensate for voltage, power, or temperature variation. By contrast, a 2 UI sampling pulse would leave only 1 UI for setup and hold.

The example depicted in FIG. 3 corresponds to an implementation of the second option described above in conjunction with FIG. 1. As discussed above, performing final multiplexing exclusively at the output stage may result in lower bandwidth due to increased parasitic coupling at the output pad. For instance, if the driver 322 is implemented using CMOS transistors, the number of transistors needed to perform 4:1 muxing may be double that which would be used to perform 2:1 muxing. The parasitic capacitance associated with these additional CMOS transistors could potentially reduce the bandwidth to the point where, because of the bandwidth limitation at the node corresponding to the output of the driver 322, the intersymbol interference exceeds the capabilities of a feed-forward equalizer (not shown) to compensate for such interference.

Figure 4:
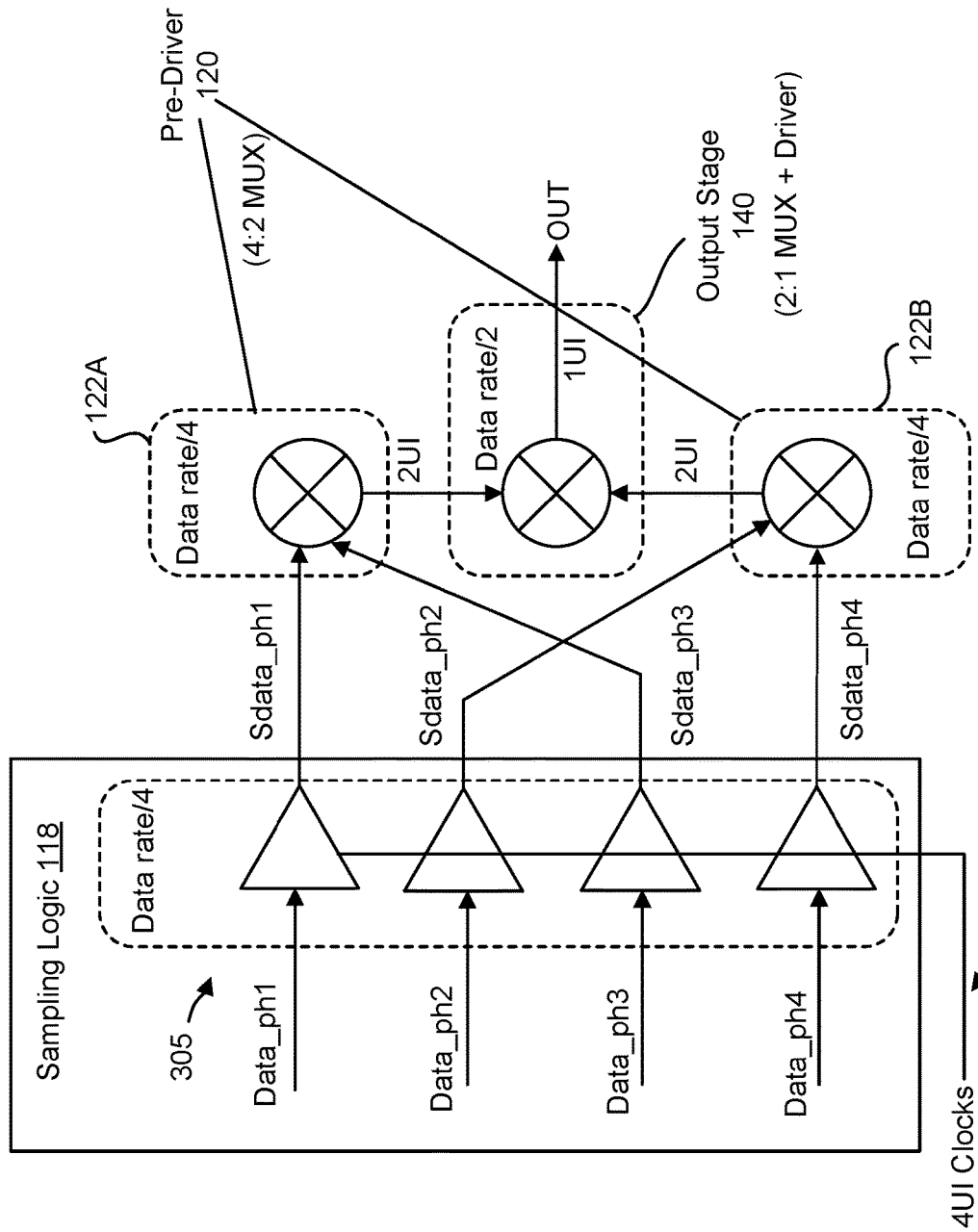
FIG. 4 is a high level schematic of an output stage and a pre-driver, according to certain embodiments.

FIG. 4 is a high level schematic of an example implementation of the pre-driver 120 and the output stage 140 as described above with respect to FIG. 2. In FIG. 4, the combinational logic 122 of the pre-driver forms a first MUX 122A and a second MUX 122B, each configured as a 2:1 MUX that combines a corresponding pair of data streams produced by the sampling logic 118 of the serializer 110. As shown in this figure, the sampling logic 118 can be implemented using the sampling units 305 in FIG. 3. Together, the first MUX 122A and the second MUX 122B operate as 4:2 MUX, with each of the two multiplexers 122A, 122B generating a respective 2 UI data stream as input to the combined 2:1 MUX and driver of the output stage 140.

Figure 5A:
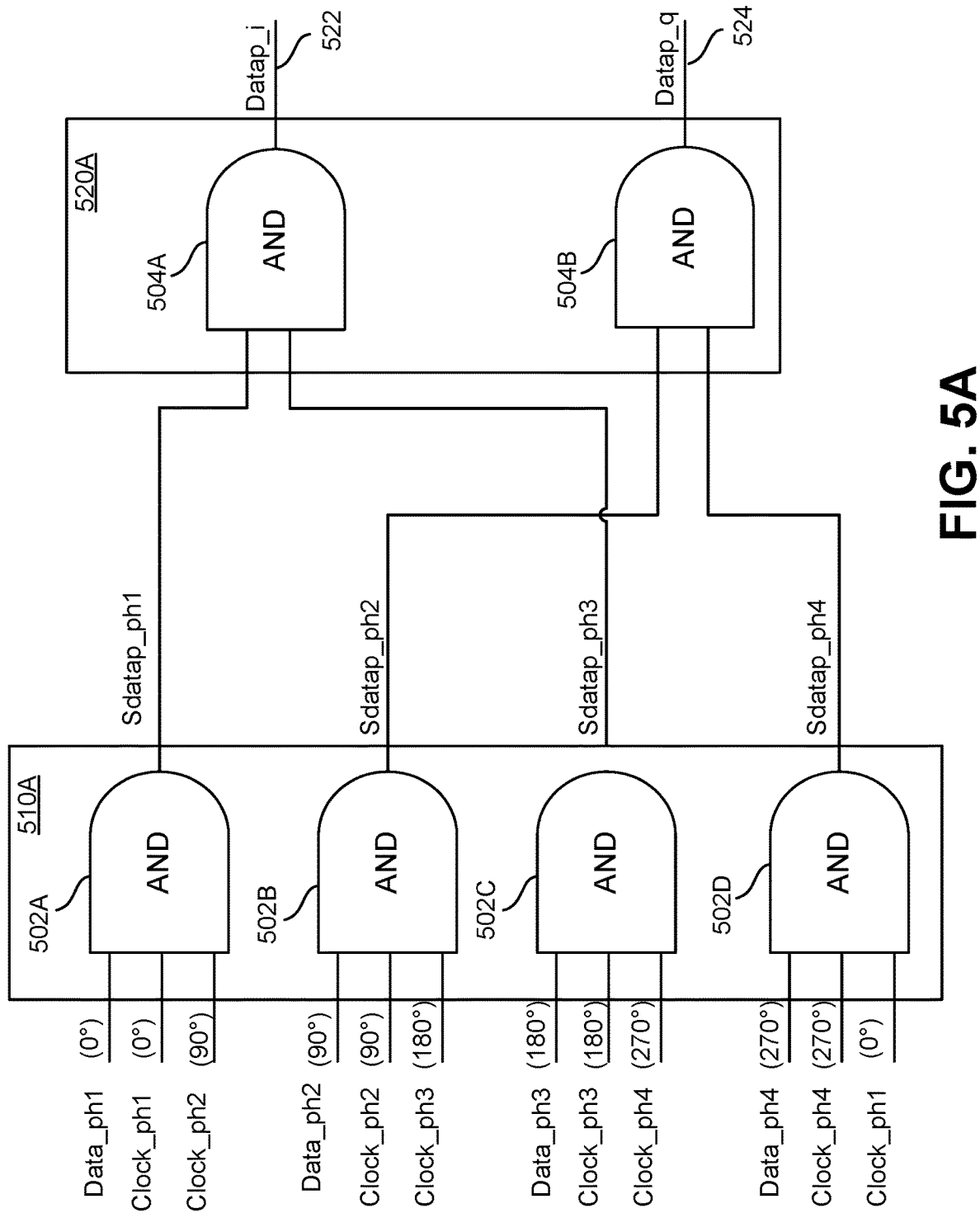
FIGS. 5A and 5B illustrate a logic implementation of a pre-driver according to certain embodiments.
Figure 5B:
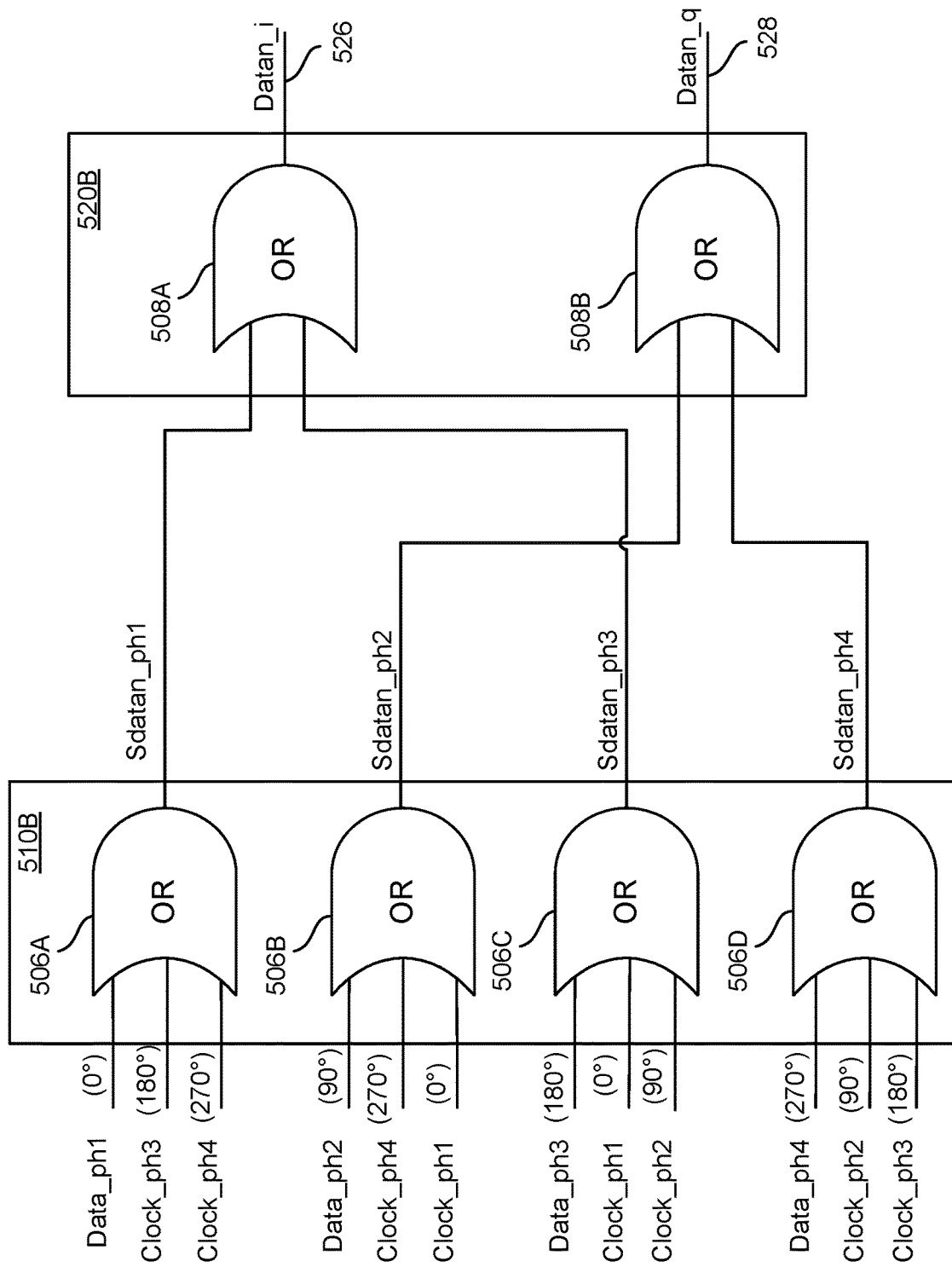

FIGS. 5A and 5B illustrate a logic implementation of a pre-driver according to certain embodiments. In FIGS. 5A and 5B, the pre-driver includes a first set of logic gates 520A and a second set of logic gates 520B. The logic gates 520A and 520B may, for example, collectively form the combinational logic 122 in FIG. 2. The inputs to the logic gates 520A and 520B are generated by logic gates 510A and logic gates 510B, respectively. The logic gates 510A and 510B may, for example, collectively form the sampling logic 118.

As shown in FIG. 5A, the logic gates 510A may include a set of AND gates 502 (e.g., 502A to 502D). In this example, each AND gate 502 is a 3-input gate having a single data input and a pair of clock inputs. The clock inputs to any particular AND gate 502 are phase-offset from each other, e.g., by 1 UI. Further, the data input is associated with the same phase as one of the clocks in the pair of clock inputs. In one example, the inputs to gate 502A are data associated with the 0 degree phase and clocks associated with the 0 and 90 degree phases; the inputs to gate 502B are data associated with the 90 degree phase and clocks associated with the 90 and 180 degree phases; the inputs to gate 502C are data associated with the 180 degree phase and clocks associated with the 180 and 270 degree phases; and the inputs to the gate 502D are data associated with the 270 degree phase and clocks associated with the 270 and 0 degree phases.

The logic gates 520A may include a set of AND gates 504 (e.g., 504A and 504B). In this example, each AND gate 504 is a 2-input gate with inputs corresponding to the output produced by a respective pair of AND gates 502. For example, AND gate 504A is shown as being coupled to the outputs of AND gates 502A and 502C, and AND gate 504B is shown as being coupled to the outputs of AND gates 502B and 502D. The output 522 of the AND gate 504A (labeled "Datap_i") may correspond to the gate input of a first PMOS transistor in the output stage 140. Similarly, the output 524 of the AND gate 504B (labeled "Datap_q") may correspond to the gate input of a second PMOS transistor in the output stage 140.

As shown in FIG. 5B, the logic gates 510B may include a set of OR gates 506 (e.g., 506A to 506D). In this example, each OR gate 506 is a 3-input gate having a single data input and a pair of clock inputs. The clock inputs to any particular OR gate 506 are phase-offset from each other, e.g., by 1 UI. Further, the data input is phase-offset from both clocks in the pair of clock inputs. In one example, the inputs to gate 506A are data associated with the 0 degree phase and clocks associated with the 180 and 270 degree phases; the inputs to gate 506B are data associated with the 90 degree phase and clocks associated with the 270 and 0 degree phases; the inputs to gate 506C are data associated with the 180 degree phase and clocks associated with the 0 and 90 degree phases; and the inputs to the gate 506D are data associated with the 270 degree phase and clocks associated with the 90 and 180 degree phases.

The logic gates 520B may include a set of OR gates 508 (e.g., 508A and 508B). In this example, each OR gate 508 is a 2-input gate with inputs corresponding to the output produced by a respective pair of OR gates 506. For example, OR gate 508A is shown as being coupled to the outputs of OR gates 506A and 506C, and OR gate 508B is shown as being coupled to the outputs of OR gates 506B and 506D. The output 526 of the OR gate 508A (labeled "Datan_i") may correspond to the gate input of a first NMOS transistor in the output stage 140. Similarly, the output 528 of the OR gate 508B (labeled "Datan_q") may correspond to the gate input of a second NMOS transistor in the output stage 140.

Figure 6:
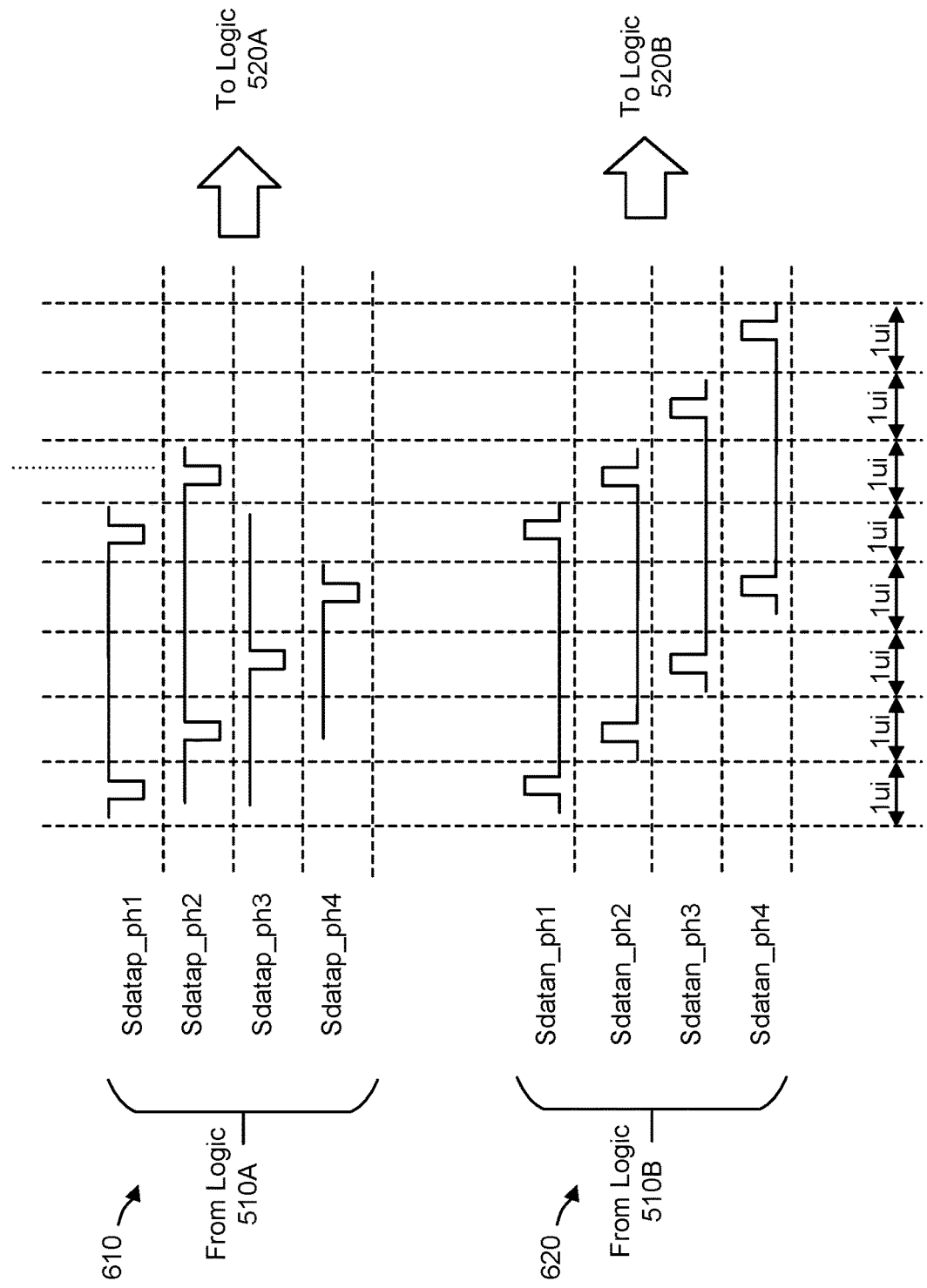
FIG. 6 shows example timing diagrams for logic forming the input to a pre-driver, according to certain embodiments.

FIG. 6 shows example timing diagrams for logic forming the input to a pre-driver, according to certain embodiments. In particular, FIG. 6 shows a set of signals 610 corresponding to the outputs of the logic gates 510A and a set of signals 620 corresponding to the outputs of the logic gates 510B. As indicated in the timing diagrams of FIG. 6, each signal represents a 4 UI stream of sampled data.

FIG. 7 shows a circuit implementation of a driver according to certain embodiments. In particular, the driver in FIG. 7 corresponds to the combined 2:1 MUX and driver of the output stage 140 as described with respect to FIG. 2. As shown in FIG. 7, the outputs 522 and 524 of the logic gates 520A may form gate inputs to a PMOS transistor 550A and a PMOS transistor 550B, respectively. Similarly, the outputs 526 and 528 of the logic gates 520B may form gate inputs to an NMOS transistor 560A and an NMOS transistor 560B, respectively. The source terminals of the PMOS transistors 550 are connected to a first supply rail 505 (e.g., Vdd). The source terminals of the NMOS transistors 560 are connected to a second supply rail 507 (e.g., Vss or ground). The drain terminals of the PMOS transistors 550 and the drain terminals of the NMOS transistors are connected through a voltage divider formed by a resistor 572A and a resistor 572B to produce the output stream at the pad 155. In some embodiments, the resistors 572A and 572B may be replaced with a single resistor having one end connected to the shared drain of the CMOS transistors and the other end connected to the pad 155. The single resistor or the pair of resistors 572A, 572B may be impedance-matched to the communications channel connecting the pad 155 to an input pad of a receiver (not shown). For example, the communications channel may correspond to a transmission line with a characteristic impedance of 50 ohms, in which case the resistor in the single resistor implementation may be a 50 ohm resistor.

FIG. 7 also includes example timing diagrams for the outputs of the logic gates 520A and 520B. As shown, each signal forming the gate input to a CMOS transistor in the output stage 140 represents 2 UI data. However, as discussed above, the logic gates 502A and 502B can produce this 2 UI data using a slower clock than that which would typically be used to generate 2 UI data for input to a driver.

Additionally, FIG. 7 shows capacitors 570A and 570B connected to the drains of the CMOS transistors. The capacitors 570A and 570B represent parasitic capacitances associated with the CMOS transistors. As discussed above, reducing the number of transistors also reduces the parasitic capacitance, leading to improved bandwidth at the output node of the driver, i.e., the pad 155.

Figure 8:
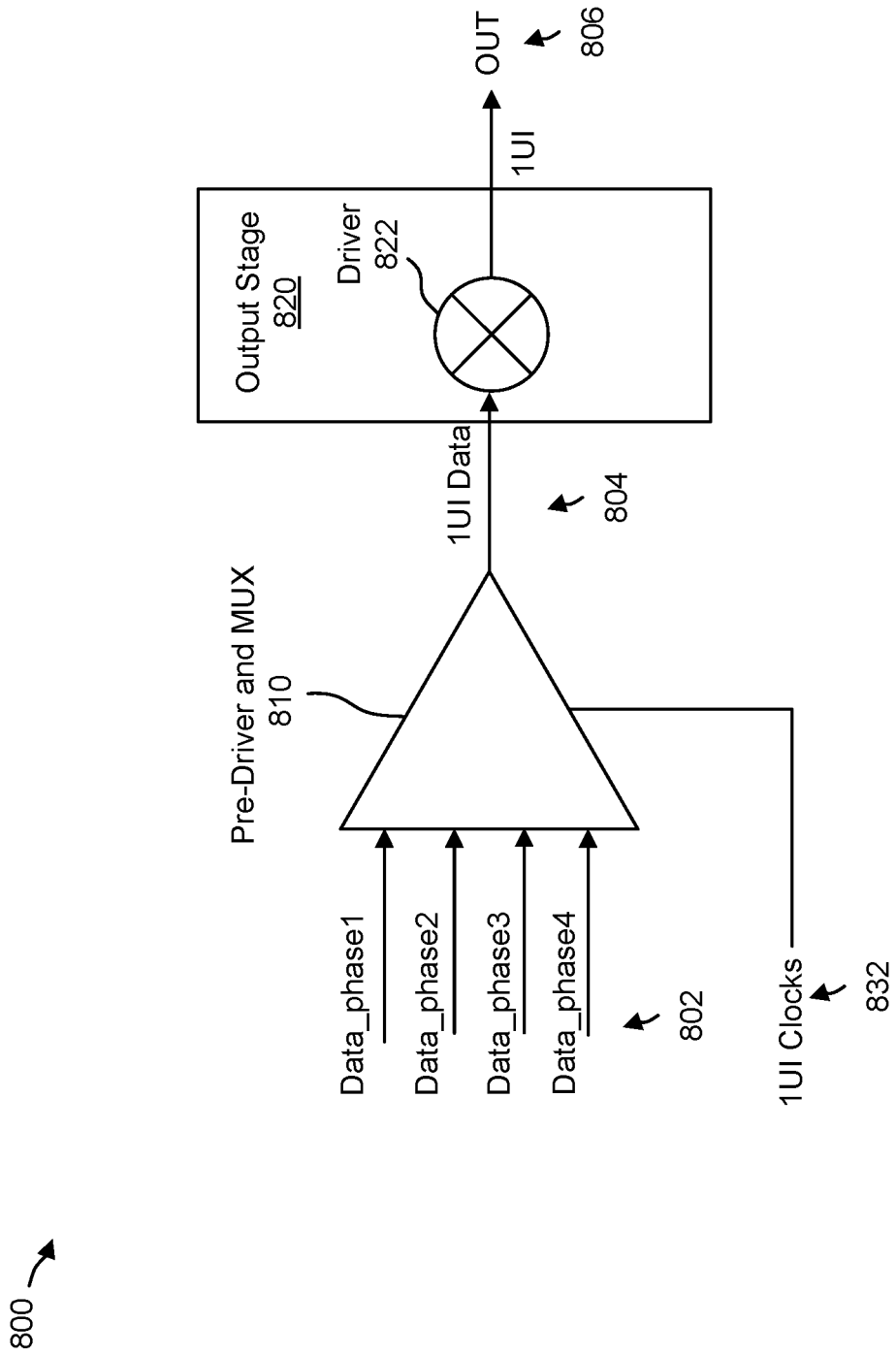
FIG. 8 is a high level schematic of an example output stage and a corresponding pre-driver.

FIG. 8 is a high level schematic of an example output stage and a corresponding pre-driver. FIG. 8 is provided as an example of an implementation in which final muxing is performed at the pre-driver to generate a serial input to the output stage. In FIG. 8, the final muxing is performed by a combined pre-driver and MUX 810. In keeping with earlier examples, the input 802 to the pre-driver and MUX 810 may be formatted as four parallel data streams, each associated with a different clock phase. As such, the pre-driver and MUX 810 may be configured to combine the input 802 into a single, 1 UI data stream 804 as input to a driver 822 in an output stage 820. No muxing is performed at the output stage 820. However, the driver 822 may be configured to perform signal conditioning as part of generating an output data stream 806 for communication through the output pad of the transmitter (e.g., pad 155).

The example depicted in FIG. 8 corresponds to an implementation of the first option described above in conjunction with FIG. 1. As discussed above, performing final multiplexing exclusively at the pre-driver may result in poor linearity. For instance, the linearity may be significantly worse compared to the examples in FIG. 3 and FIG. 4 because the node where the data stream 804 is generated as the input to the driver 822 is tasked with supplying data at full baud rate (e.g., 56 Gbps). Further, although the first option was described in connection with a quarter rate clock, FIG. 8 shows clock signals 832 to the pre-driver and MUX 810 as being 1 UI, so the pre-driver and MUX 810 may be operating off a full rate clock (e.g., 56 Ghz), in which case the power consumption of the transmitter would be much higher than either of the examples in FIG. 3 and FIG. 4.

Figure 9:
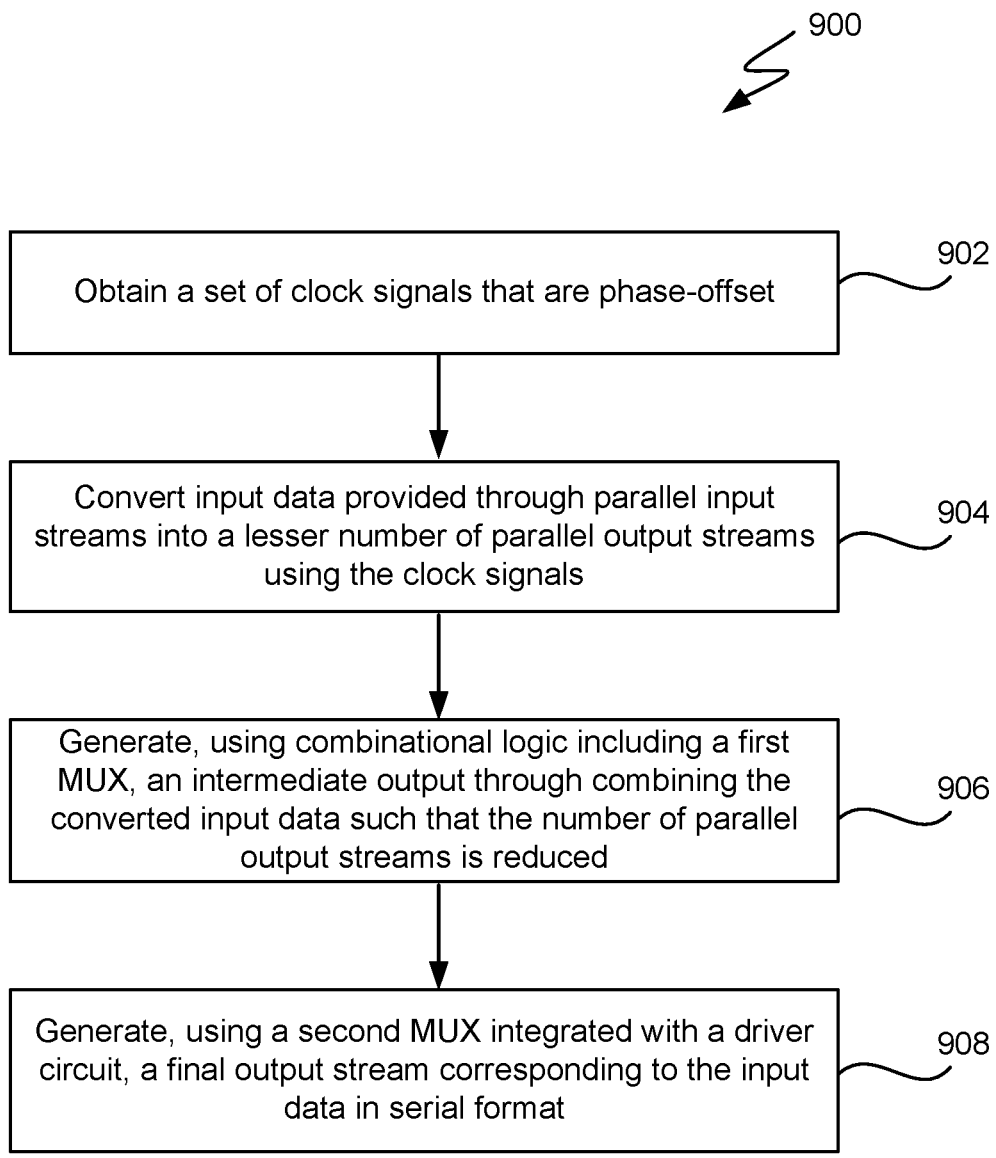
FIG. 9 is a flowchart illustrating a method of serializing data, according to certain embodiments.

FIG. 9 is a flowchart illustrating a method 900 of serializing data, according to certain embodiments. The method 900 can be performed using a transmitter configured in accordance with one or more of the exemplary embodiments described above. For instance, the transmitter performing the method 900 may be configured according to the example shown in FIG. 2. At 902, a set of clock signals that are phase-offset is obtained. The clock signals may correspond to the clock signals 132, in which case the clock signals may include at least four clock signals having the same frequency but different phases (e.g., 0, 90, 180, and 270 degrees). The phase offsets of the clock signals may determine the duration of the sampling pulses used to sample input data, e.g., as part of the conversion process in 904, discussed below.

At 904, input data provided through parallel input streams is converted into a lesser number of parallel output streams using the clock signals obtained at 902. The functionality in 904 may be implemented using one or more stages of a serializer to prepare the input data for further serialization. The number of parallel output streams depends on implementation. In general, the input data may be formatted as N number of input streams, and the number of parallel output streams is some number less than N. In the example of FIG. 2, N=40, and the serializer 110 is configured to produce four parallel output streams. Additionally, as shown in FIG. 2, the circuitry forming these parallel output streams may include digital circuits, analog circuits, or a combination of digital and analog circuits.

At 906, combinational logic including a first MUX is used to generate an intermediate output through combining the converted input data such that the number of parallel output streams is reduced. The combinational logic including the first MUX may correspond to a pre-diver coupled to the final stage of a serializer. For instance, the combinational logic may implement a 4:2 MUX coupled to sampling logic, e.g., the pre-driver 120 in FIG. 2. Further, the sampling logic and/or the combinational logic including the first MUX may be formed using AND gates and OR gates, as shown in FIGS. 5A and 5B. However, other types of logic elements may also be used.

At 908, a second MUX is used to generate a final output stream corresponding to the input data in serial format. The second MUX is integrated with a driver circuit and may, for example, correspond to the 2:1 MUX of the output stage 140 in FIG. 2. Further, the combinational logic including the first MUX may configure the intermediate output to operate as both control input and data input to the second MUX. An example of such a muxing arrangement is shown in FIG. 7 where, as discussed above, the gate inputs of the CMOS transistors correspond to the outputs of the logic gates 520A and 520B.

Some portions of the preceding detailed descriptions have been presented in terms of algorithms and symbolic representations of operations on data bits. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within memories or registers into other data similarly represented as physical quantities within the memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A system comprising:
    a clock source configured to generate a set of clock signals that are phase-offset;
    serialization circuitry configured to convert input data provided through parallel input streams into a lesser number of parallel output streams, whereto to convert the input data, the serialization circuitry samples the input data using the clock signals;
    a pre-driver circuit comprising combinational logic including a first multiplexer, wherein the first multiplexer is configured to generate an output of the pre-driver circuit through combining the converted input data such that the lesser number of parallel output streams is further reduced; and
    a driver circuit configured to generate, using the output of the pre-driver circuit, a final output stream corresponding to the input data in serial format, wherein the driver circuit is integrated with a second multiplexer, and wherein the output of the pre-driver circuit operates as both control input and data input to the second multiplexer.

2. The system of claim 1, wherein:
    the driver circuit comprises a plurality of p-channel metal-oxide-semiconductor (PMOS) transistors and a plurality of n-channel metal-oxide-semiconductor (NMOS) transistors; and
    the output of the pre-driver circuit forms gate inputs to the PMOS transistors and the NMOS transistors.

3. The system of claim 2, wherein the combinational logic of the pre-driver circuit comprises:
    a plurality of OR gates, each OR gate forming a gate input to a corresponding NMOS transistor; and
    a plurality of AND gates, each AND gate forming a gate input to a corresponding PMOS transistor.

4. The system of claim 2, wherein the final output stream is formed at a node where drain terminals of the PMOS transistors are connected to drain terminals of the NMOS transistors.

5. The system of claim 1, wherein:
    the serialization circuitry comprises a first set of logic gates, each logic gate in the first set of logic gates operating on a corresponding data input and a subset of the clock signals generated by the clock source; and
    the combinational logic of the pre-driver circuit comprises a second set of logic gates, each logic gate in the second set of logic gates operating on outputs from two or more logic gates in the first set of logic gates.

6. The system of claim 5, wherein the subset of clock signals on which a logic gate in the first set of logic gates operates is a pair of clock signals that are phase-offset by one unit interval.

7. The system of claim 1, wherein the set of clock signals represents four phases of a clock operating at a frequency four times slower than a baud rate of the final output stream.

8. The system of claim 7, wherein the first multiplexer generates the output of the pre-driver circuit at half the baud rate of the final output stream.

9. The system of claim 1, wherein the first multiplexer is a 4:2 multiplexer, and wherein the second multiplexer is a 2:1 multiplexer.

10. The system of claim 1, wherein the final output stream corresponds to an output of a transmitter in a Serializer-Deserializer (SerDes) interface.

11. A method comprising:
    obtaining a set of clock signals that are phase-offset;
    converting input data provided through parallel input streams into a lesser number of parallel output streams, wherein the converting of the input data comprises sampling the input data using the clock signals;
    generating, using combinational logic including a first multiplexer, an intermediate output through combining the converted input data such that the lesser number of parallel output streams is further reduced; and
    generating, using a second multiplexer integrated with a driver circuit, a final output stream corresponding to the input data in serial format, wherein the intermediate output operates as both control input and data input to the second multiplexer.

12. The method of claim 11, wherein:
    the driver circuit comprises a plurality of p-channel metal-oxide-semiconductor (PMOS) transistors and a plurality of n-channel metal-oxide-semiconductor (NMOS) transistors; and
    the intermediate output forms gate inputs to the PMOS transistors and the NMOS transistors.

13. The method of claim 12, wherein the combinational logic comprises:
    a plurality of OR gates, each OR gate forming a gate input to a corresponding NMOS transistor; and
    a plurality of AND gates, each AND gate forming a gate input to a corresponding PMOS transistor.

14. The method of claim 12, wherein the final output stream is formed at a node where drain terminals of the PMOS transistors are connected to drain terminals of the NMOS transistors.

15. The method of claim 11, wherein:
- the converting of the input data is performed using a first set of logic gates, each logic gate in the first set of logic gates operating on a corresponding data input and a subset of the clock signals; and
- the generating of the intermediate output is performed using a second set of logic gates, each logic gate in the second set of logic gates operating on outputs from two or more logic gates in the first set of logic gates.

16. The method of claim 15, wherein the subset of clock signals on which a logic gate in the first set of logic gates operates is a pair of clock signals that are phase-offset by one unit interval.

17. The method of claim 11, wherein the set of clock signals represents four phases of a clock operating at a frequency four times slower than a baud rate of the final output stream.

18. The method of claim 17, wherein the first multiplexer generates the intermediate output at half the baud rate of the final output stream.

19. The method of claim 11, further comprising:
- transmitting the final output stream to a receiver device through a Serializer-Deserializer (SerDes) interface.

* * * * *